(12) United States Patent
Kim (10) Patent No.: US 7,863,604 B2
(45) Date of Patent: Jan. 4, 2011

(54) ORGANIC LIGHT EMITTING DISPLAY DEVICE AND MANUFACTURING THE SAME

(75) Inventor: Jong-Yun Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 11/979,937

(22) Filed: Nov. 9, 2007

(65) Prior Publication Data
US 2008/0111494 A1 May 15, 2008

(30) Foreign Application Priority Data
Nov. 10, 2006 (KR) .................. 10-2006-0111175

(51) Int. Cl.
*H01L 35/24* (2006.01)
(52) U.S. Cl. ............ 257/40; 257/E33.063; 313/504; 349/42; 349/43
(58) Field of Classification Search ............ 257/40, 257/59, 72, 83, E33.063, E33.064, E51.005; 313/504, 505, 506, 509; 349/43, 42, 147
See application file for complete search history.

(56) References Cited

U.S. PATENT DOCUMENTS

| | | | |
|---|---|---|---|
| 6,674,502 B1 * | 1/2004 | Terakado et al. ............ 349/147 |
| 2005/0275339 A1 * | 12/2005 | Seo et al. ............ 313/503 |
| 2005/0285114 A1 * | 12/2005 | Kang et al. ............ 257/72 |
| 2006/0006794 A1 * | 1/2006 | Sakakura et al. ............ 313/503 |
| 2007/0273814 A1 * | 11/2007 | You et al. ............ 349/114 |

FOREIGN PATENT DOCUMENTS

| | | |
|---|---|---|
| KR | 1994-0016918 | 7/1994 |
| KR | 2005-0087283 | 8/2005 |
| KR | 10-2005-0108156 | 11/2005 |

OTHER PUBLICATIONS

William R. Robinson et al., "Concepts and Models", 1992, Heath and Company, ISBN 0-669-32800-6, A25, 596-605.*

(Continued)

*Primary Examiner*—Davienne Monbleau
*Assistant Examiner*—Shweta Mulcare
(74) *Attorney, Agent, or Firm*—Robert E. Bushnell, Esq.

(57) ABSTRACT

Provided are an organic light emitting display device (OLED), which can prevent the occurrence of galvanic corrosion and ensure reliable adhesion of source and drain electrodes with a first electrode during rework of the first electrode, and a method of fabricating the same. The OLED includes a substrate; a thin film transistor (TFT) disposed on the substrate and including a semiconductor layer, a gate electrode, and source and drain electrodes; a first metal layer disposed on the source and drain electrodes of the TFT; an insulating layer disposed on the substrate including the first metal layer; a first electrode disposed on the insulating layer and electrically connected to the TFT, the first electrode including a second metal layer; a pixel defining layer disposed on the first electrode; an organic layer disposed on the pixel defining layer; and a second electrode disposed on the organic layer.

16 Claims, 6 Drawing Sheets

OTHER PUBLICATIONS

Douglas A. Skoog et al., "Analytical Chemistry an Introduction" 2000, Brooks/Cole Thomson Learning, Seventh Edition, 403-406.*

Korean Notice of Allowability corresponding to Korean Patent Application No. 2006-0111175 issued on Dec. 31, 2007.

Aluminum Nitride, AlN http://www.accuratus.com/alumni.html.

Jeong-Youb Lee et al., "Effect of Deposition Condition on the Physical and Electrical Properties of Reactive Sputtered Molybdenum Nitride Film" Department of Metallurgical Engineering, Hanyang Univ. Seoul, Korea http://www.springerlink.com/content/x18u24320r60465h.

Mindaugas Lukosius et al., "Atomic Vapor Deposition of Titanium Nitride as Metal Electrodes for Gate-last CMOS and MIM Devices" http://www3.interscience.wiley.com/journal/119882077/abstract?CRETRY=1&SRETRY=0.

Chromium Nitride (CrN) PVD Coating http://brycoat.com/pvd-crn-chart.html.

H.B. Nie et al., "Structural and Electrical Properties of Tantalum Nitride Thin Films Fabricated by Using Reactive Radio-frequency Magnetron Sputtering" Applied Physics A: Materials Science & Processing, vol. 73, No. 2, Aug. 2001 http://www.springerlink.com/content/aegb7pmum0nvmedk/.

Byung Lyul Park et al., "Characteristics of PECVD Grown Tungsten Nitride Films as Diffusion Barrier Layers for ULSI DRAM Applications" Journal of Electronic Materials, vol. 26, No. 2, 1997 http://www.springerlink.com/content/fq52024781749557/.

* cited by examiner

ORGANIC LIGHT EMITTING DISPLAY DEVICE AND MANUFACTURING THE SAME

CLAIM OF PRIORITY

This application makes reference to, incorporates the same herein, and claims all benefits accruing under 35 U.S.C. §119 from an application for ORGANIC LIGHT EMITTING DISPLAY DEVICE AND MANUFACTURING THE SAME earlier filed in the Korean Intellectual Property Office on the 10 of Nov. 2006, and there duly assigned Serial No. 2006-111175.

BACKGROUND OF THE INVENTION

1. Field of the Invention

The present invention relates to an organic light emitting display device (OLED) and a method of manufacturing the same, and more particularly, to an OLED and a method of manufacturing the same, which can prevent galvanic corrosion and deterioration of adhesion between a first electrode and the source and drain electrodes during rework of the first electrode.

2. Description of the Related Art

Generally, an organic light emitting display device (OLED) is a self-emissive display device which emits light by exciting fluorescent organic compounds. The OLED may be classified as either a passive matrix (PM) type and an active matrix (AM) type, depending upon how and N×M number of unit pixels that are arranged in a matrix shape are driven to emit light. In comparison to the PM type, the AM type is adequate for large-area devices due to its low power consumption and its high resolution.

OLEDs may also be divided into a top-emitting OLED, a bottom-emitting OLED, and a double-sided emitting OLED, depending upon the direction in which light is emitted from organic compounds incorporated into the OLED. Unlike the bottom-emitting OLED, the top-emitting OLED emits light in a direction extending opposite to a substrate on which pixels are arranged; the top-emitting OLED has an advantage of a high aperture ratio.

In the top-emitting OLED, a first electrode may be formed of a conductive material with excellent reflective characteristics and an appropriate work function. It is difficult however, to find an electrically conductive material that satisfies all of the above-described requirements. To solve this problem, the first electrode of a top-emitting OLED may include a reflective layer for reflecting light.

A typical OLED may be constructed with an interlayer insulating layer formed on the entire surface of a substrate bearing a gate electrode, and the interlayer insulating layer is etched to expose a predetermined region of the semiconductor layer through contact holes. A material is deposited on the entire surface of the substrate and is patterned to form source and drain electrodes which are connected to region of the semiconductor layer. A planarization layer is formed on the entire surface of the substrate and is etched to form a via hole which exposes any one of the source and drain electrodes. A reflective layer and a first electrode are formed on the planarization layer and are connected to one of the source and drain electrodes.

If inspection reveals either the reflective layer or the first electrode to be incompletely formed, the reflective layer or the first electrode must be removed and formed again using a rework process. During the removal however, when the source and drain electrodes and the reflective layer which is in contact with the source and drain electrodes are simultaneously exposed to an etchant. The source and drain electrodes have a low electromotive force (EMF) and lose electrons at higher rate than does the reflective layer, which has a higher EMF; thus, the source and drain electrodes are etched at higher rate than is the reflective layer. The EMF in the instant application is measured against a standard hydrogen reference electrode. The EMF may be alternatively named as the standard electrode potential. Owing to its high EMF, the reflective layer will attract electrons while re-depositing the etchant on the reflective layer. As the rate of etching of the reflective layer slows down, galvanic corrosion occurs. As a result, the rework process is difficult, and adhesion between the source and drain electrodes, and the first electrode and the reflective layer deteriorates, thereby causing a concomitant increase in contact resistance between the source and drain electrodes, and the first electrode and the reflective layer.

SUMMARY OF THE INVENTION

It is therefore, one object of the present invention to provide an improved organic light emitting display device (OLED) and an improved process for manufacturing organic light emitting display devices.

It is another object to provide an organic light emitting display device (OLED) and a method of manufacturing an OLEDs able to ameliorate galvanic corrosion and deterioration of adhesion between a first electrode and the source and drain electrodes during rework of the first electrode.

These and other objects may be attained with an exemplary embodiment of an OLED illustrating the principles of the present invention constructed with a substrate; a thin film transistor (TFT) disposed on the substrate with a semiconductor layer, a gate electrode, a source electrode and a drain electrode; a first metal layer disposed on the source and drain electrodes of the TFT; an insulating layer disposed on the substrate bearing the first metal layer; and a first electrode disposed on the insulating layer and electrically connected to the TFT. The first electrode may include a second metal layer. A pixel defining layer may be disposed on the first electrode; an organic layer may be disposed on the pixel defining layer; and a second electrode may be disposed on the organic layer.

In another exemplary embodiment of the present invention, a method of manufacturing an OLED contemplates the step of providing a substrate; and forming a TFT on the substrate, with the TFT including a semiconductor layer, a gate electrode, a source electrode and a drain electrode. A first metal layer may be formed on the source and drain electrodes of the TFT; an insulating layer may be formed on the substrate including the first metal layer; and a first electrode including a second metal layer may be disposed on the insulating layer. A pixel defining layer may be formed on the entire surface of the substrate to expose the first electrode; an organic layer may be formed on the exposed first electrode; and a second electrode may be formed on the entire surface of the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
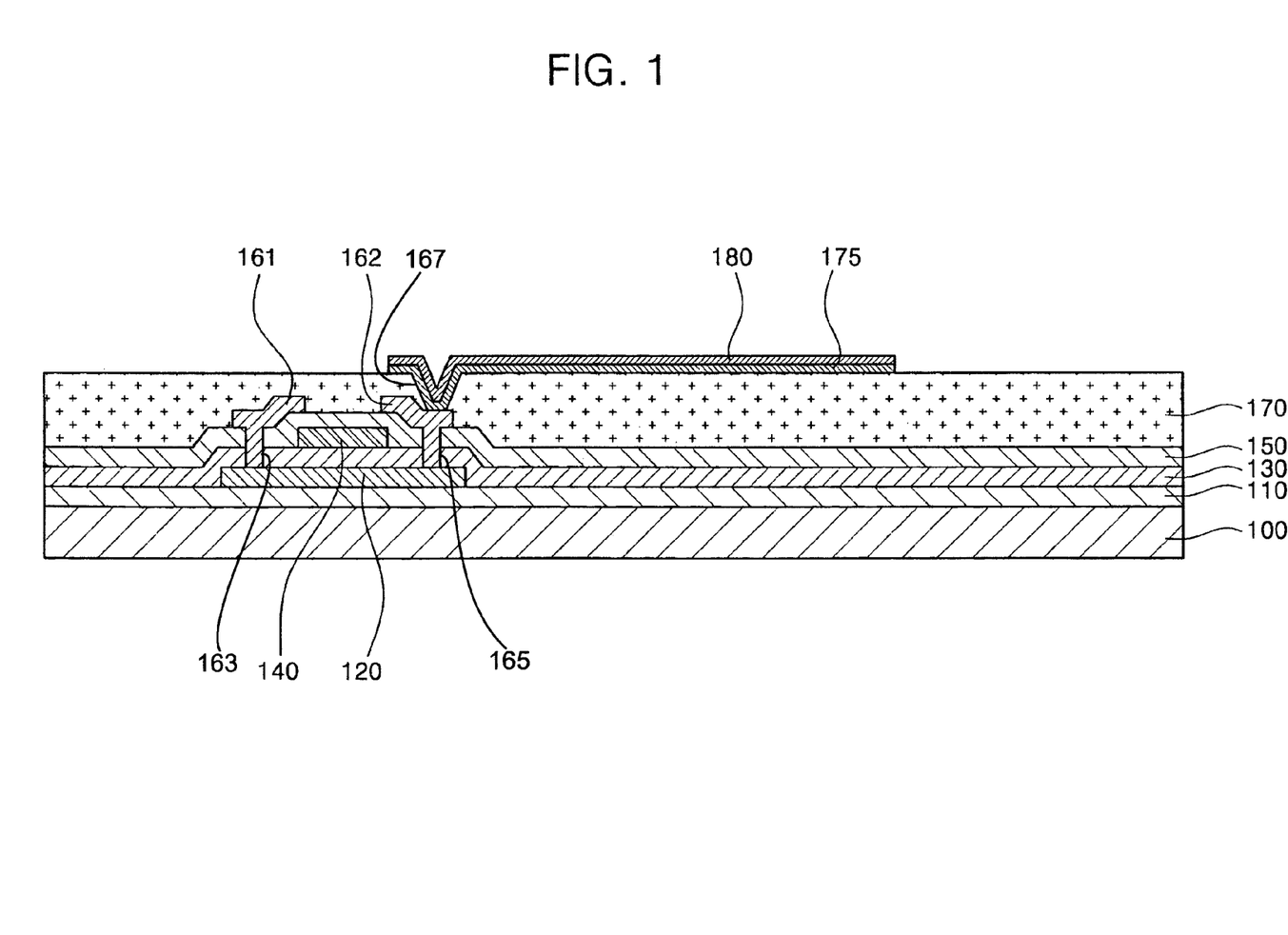
FIG. 1 is a cross-sectional view of a contemporary organic light emitting display device (OLED)

Turning now to the drawings, FIG. 1 is a cross-sectional view of a contemporary OLED which may be constructed with buffer layer 110 is formed on a substrate 100 that may be an insulating glass, a conductive substrate, or a plastic substrate. An amorphous silicon (a-Si) layer is formed on the buffer layer 110 and crystallized into a polycrystalline silicon (poly-Si) layer to form a semiconductor layer 120.

Gate insulating layer 130 is formed on the entire surface of the substrate 100 including the upper surface of semiconductor layer 120, and gate electrode 140 is formed on the surface of gate insulating layer 130 to correspond to a predetermined region of the semiconductor layer 120. Subsequently, interlayer insulating layer 150 is formed on the entire surface of substrate 100 bearing gate electrode 140; and interlayer insulating layer 150 is etched to expose predetermined regions of semiconductor layer 120, thereby forming contact holes 163, 165.

Thereafter, a material used to form source and drain electrodes is deposited on the entire surface of the substrate 100 and then patterned to form electrically separate source and drain electrodes 161 and 162 connected to different predetermined regions of semiconductor layer 120. Planarization layer 170 is formed on the entire surface of the substrate 100 and etched to form a via hole 167 that exposes any one of source and drain electrodes 161 and 162. Reflective layer 175 and first electrode 180 are formed on planarization layer 170 and are electrically connected to any one of source and drain electrodes 161 and 162.

In this case, when reflective layer 175 or first electrode 180 is incompletely formed, reflective layer 175 or first electrode 180 is removed and formed again during rework steps in the course of the manufacturing process.

When source and drain electrodes 161 and 162, and reflective layer 175 which is in electrical contact with one of source and drain electrodes 161 and 162, are exposed to an etchant at the same time during the rework process, source and drain electrodes 161 and 162 which have a low electromotive force (EMF), tend to lose electrons at a higher rate than does reflective layer 175 which has a higher EMF. Consequently, source and drain electrodes 161 and 162 are etched at a higher rate than is reflective layer 175. Owing to its higher EMF, reflective layer 175 obtains electrons while re-depositing materials from the etchant onto reflective layer 175. Thus, as the rate of etching of reflective layer 175 slows down, galvanic corrosion occurs. As a result, it becomes difficult to satisfactorily complete the rework process, and adhesion of source and drain electrodes 161 and 162 with first electrode 180 and reflective layer 175 deteriorates, thus increasing contact resistance between first electrode 180 and reflective layer 175.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements.

FIGS. 2 through 5 show a sequence of cross-sectional views that illustrate successive steps performed during the manufacture of an exemplary embodiment of an organic light emitting display device (OLED) constructed according to the principles of the present invention.

Figure 2:
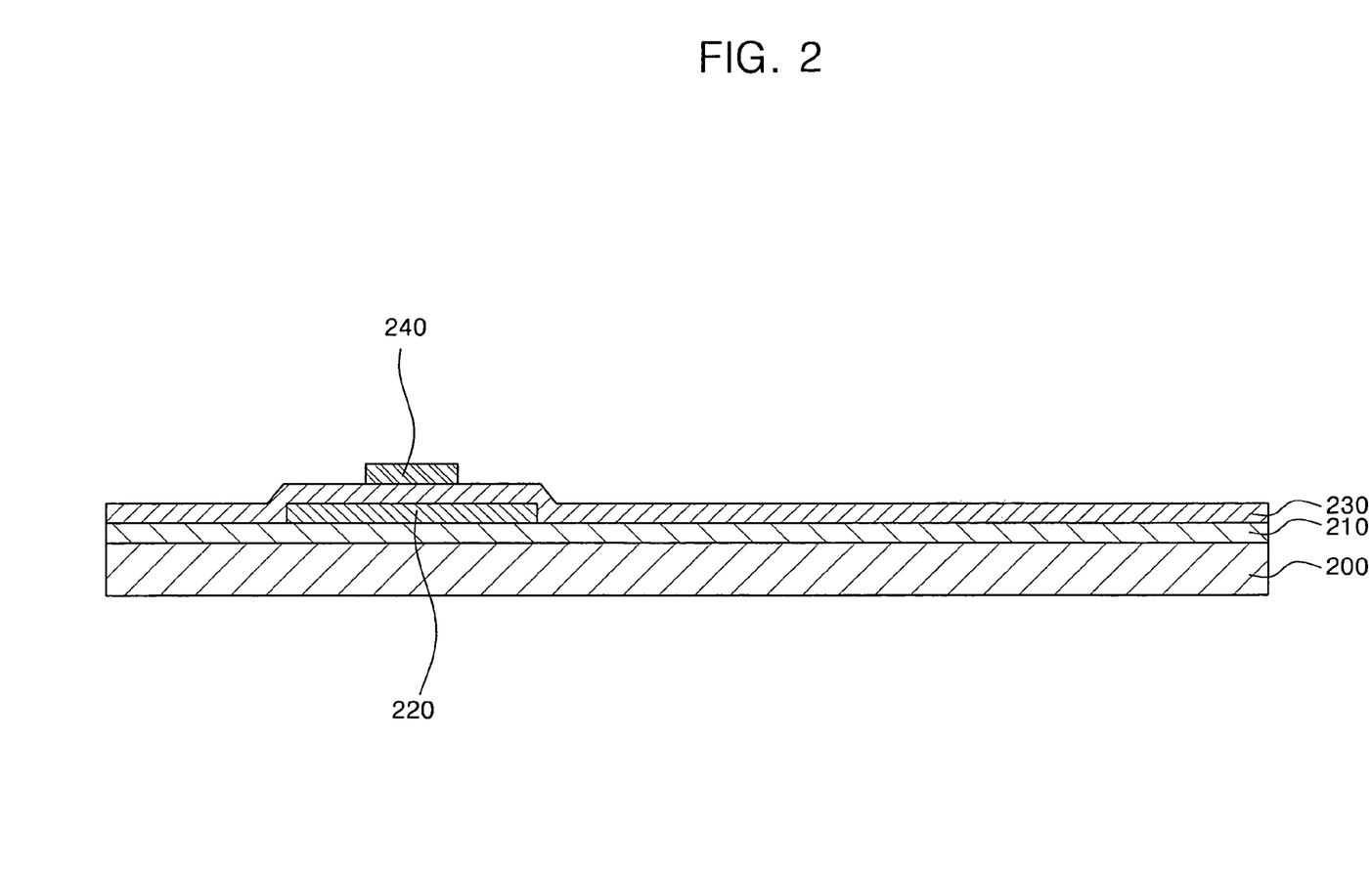
FIG. 2 is a cross-sectional view of an exemplary embodiment of an organic light emitting display device after formation of a gate electrode in accordance with the principles of the present invention.

Referring now to FIG. 2, substrate 200 is provided. Substrate 200 may be an insulating glass substrate, a plastic substrate, or a conductive substrate. Buffer layer 210 is formed on substrate 200. Buffer layer 210 may be a silicon oxide layer, a silicon nitride layer, or a combination thereof. Also, buffer layer 210 prevents the diffusion of impurities from underlying substrate 200.

A semiconductor layer 220 is formed on buffer layer 210. Semiconductor layer 220 may be a polycrystalline silicon layer that is obtained by crystallizing an amorphous silicon layer using at least one material selected from the group including a rapid thermal annealing (RTA) process, a solid phase crystallization (SPC) process, an excimer laser annealing (ELA) process, a metal induced crystallization (MIC) process, a metal induced lateral crystallization (MILC) process, and a sequential lateral solidification (SLS) process.

Thereafter, gate insulating layer 230 is formed on the entire surface of substrate 200 including semiconductor layer 220. Gate insulating layer 230 may be a silicon oxide layer, a silicon nitride layer, or a layer of a combination of silicon oxide and silicon nitride.

A material for a gate electrode is deposited on gate insulating layer 230 and patterned, thereby forming gate electrode 240 corresponding to a predetermined region of semiconductor layer 220. The material for gate electrode 240 may be selected from the group that includes aluminum (Al), an aluminum (Al) alloy, molybdenum (Mo), and a molybdenum (Mo) alloy. More preferably, the material for gate electrode 240 may be a molybdenum-tungsten (Mo—W) alloy.

Figure 3:
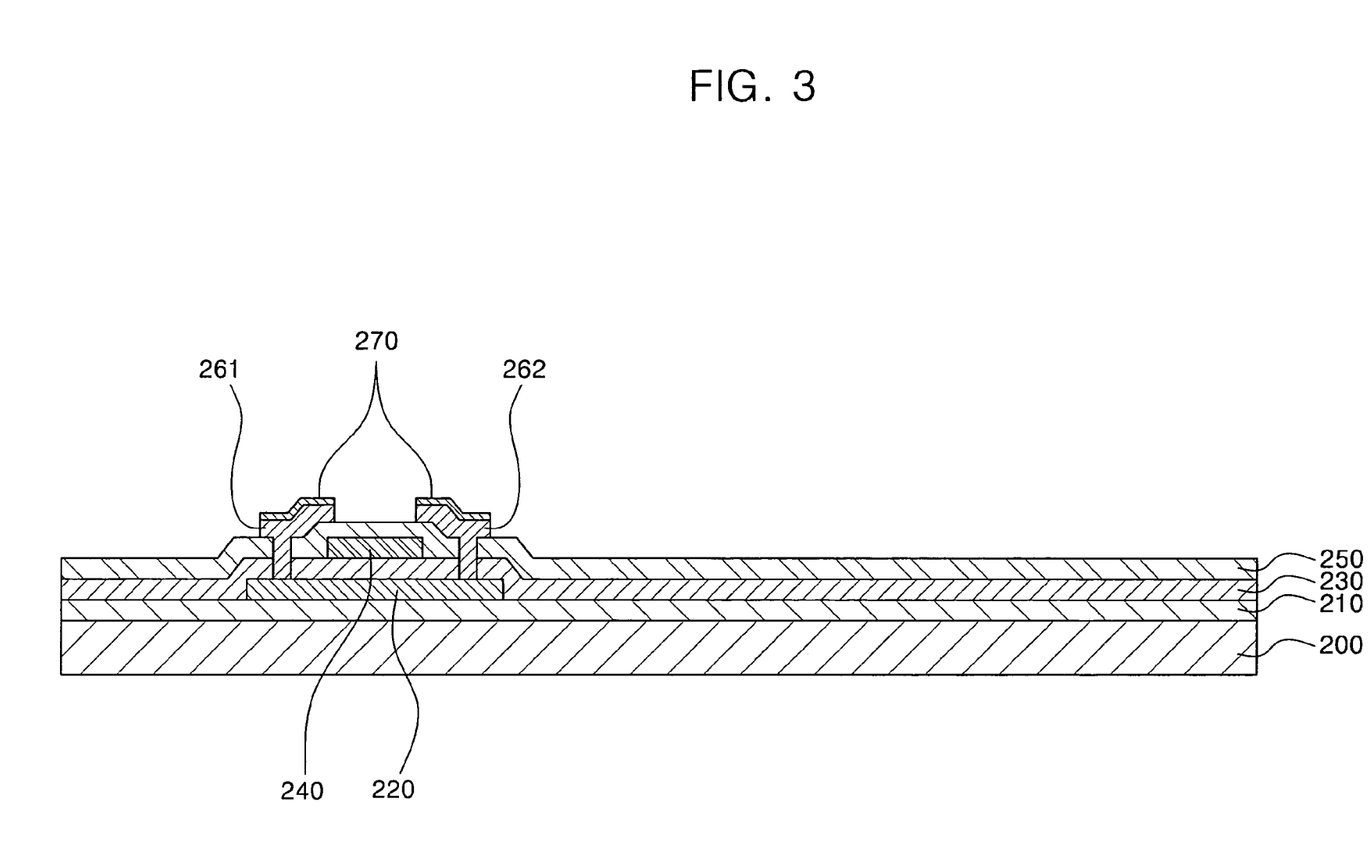
FIG. 3 is a cross-sectional view of an exemplary embodiment of an organic light emitting display device after formation of source and drain electrodes in accordance with the principles of the present invention.

Referring now to FIG. 3, interlayer insulating layer 250 is formed across the entire surface of substrate 200. Interlayer insulating layer 250 may be a silicon oxide layer, a silicon nitride layer, or a double layer of a silicon oxide layer and a silicon nitride layer.

Gate insulating layer 230 and interlayer insulating layer 250 are etched to form contact holes 263, 265 respectively exposing both of diametrically opposite end portions of semiconductor layer 220. Thereafter, a material for source and drain electrodes 261, 262 and a material for first metal layer 270 are sequentially deposited on the entire surface of substrate 200 and patterned at the same time, thereby forming source and drain electrodes 261 and 262 and first metal layer 270.

Figure 6:
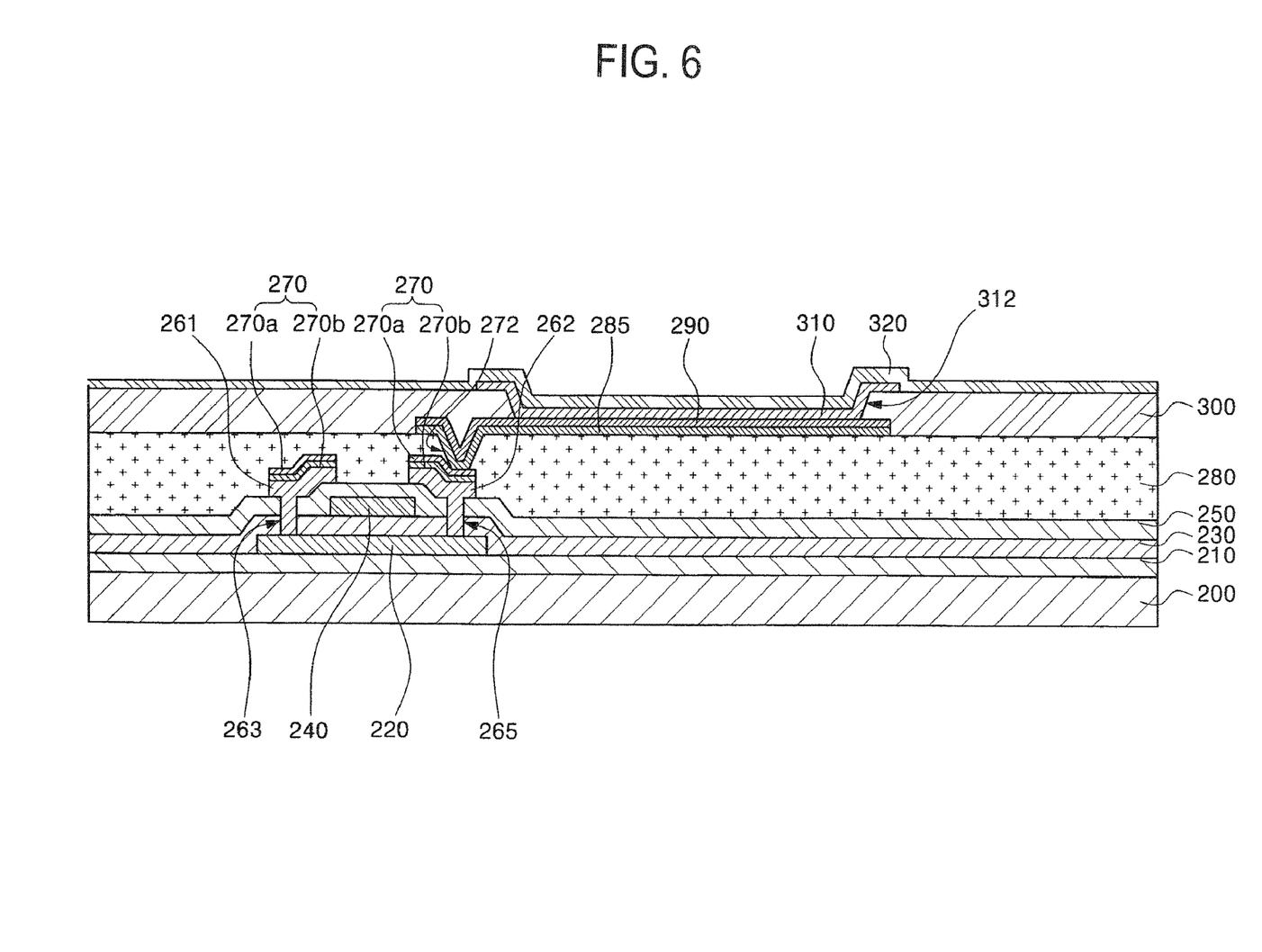
FIG. 6 is a cross-sectional view of an exemplary embodiment of an organic light emitting display device which includes a first metal layer having a double layer, in accordance with the principles of the present invention.

In this case, source and drain electrodes 261 and 262 may be formed using a single layer formed of one selected from the group which includes Al, an Al alloy, Mo, a Mo alloy, and chrome (Cr) or a stacked layer formed of one material selected from the group which includes Al/MoW, Ti/Al/Ti, and Al/Ta. Preferably, source and drain electrodes 261 and 262 may be formed using a triple layer formed of Ti/Al/Ti. Also, first metal layer 270 may be formed by depositing a single layer formed of a material selected from the group which includes Ag, Pt, and Au. Alternatively, first metal layer 270 may be formed by depositing a double layer formed of a material selected from the group which includes Ag/Pt, Pt/Au, and Ag/Au. The first metal layer having the double layer is shown in FIG. 6. As shown in FIG. 6, the first metal layer 270 may be formed by a first layer 270a and a second layer 270b. For example, the first layer 270a may be formed of Ag when the second layer 270b may be formed of Pt; the first layer 270a may be formed of Ag when the second layer 270b may be formed of Au; and the first layer 270a may be formed of Pt when the second layer 270b may be formed of Au. In this case, first metal layer 270 may be formed of a material having an EMF equal to or higher than that of second metal layer 285 that will be formed later. Thus, when first and second metal layers 270 and 285 are simultaneously exposed to an etchant during a subsequent process of reworking a first electrode, the occurrence of galvanic corrosion in which a material having a lower EMF is first etched can be prevented.

Therefore, since first metal layer 270 has a higher EMF than second metal layer 285, etching of first metal layer 270 may be averted, or prevented. Thus, the underlying source and drain electrodes 261 and 262 are protected so that reliable adhesion of source and drain electrodes 261 and 262 with a first electrode 290 (refer to FIG. 4) and second metal layer 285 may be reliably ensured, even during etching performed as a step in a reworking process.

Here, first metal layer 270 is preferably constructed as a double layer obtained by depositing a material layer with a lower EMF on a material layer with a higher EMF. For example, since Ag has an EMF of 0.799 V, Pt has an EMF of 1.2 V, and Au has an EMF of 1.63 V, first metal layer 270 may be a double layer of Ag/Pt, Ag/Au, or Pt/Au, in which a material having a higher EMF is disposed below. In this case, a lower layer of first metal layer 270, which is in contact with source and drain electrodes 261 and 262, has a higher EMF, thus preventing source and drain electrodes 261 and 262 from being etched during a subsequent process of reworking first electrode 290. As a result, the occurrence of galvanic corrosion can be effectively inhibited during the subsequent process of reworking first electrode 290.

Also, first metal layer 270 may be formed to a thickness within a range of about 200 Å to about 800 Å. When first metal layer 270 has a thickness of less than 200 Å, first metal layer 270 may galvanically corrode. When first metal layer 270 has a thickness of more than 800 Å, contact resistance between first metal layer 270 and first electrode 290 becomes too high.

Figure 4:
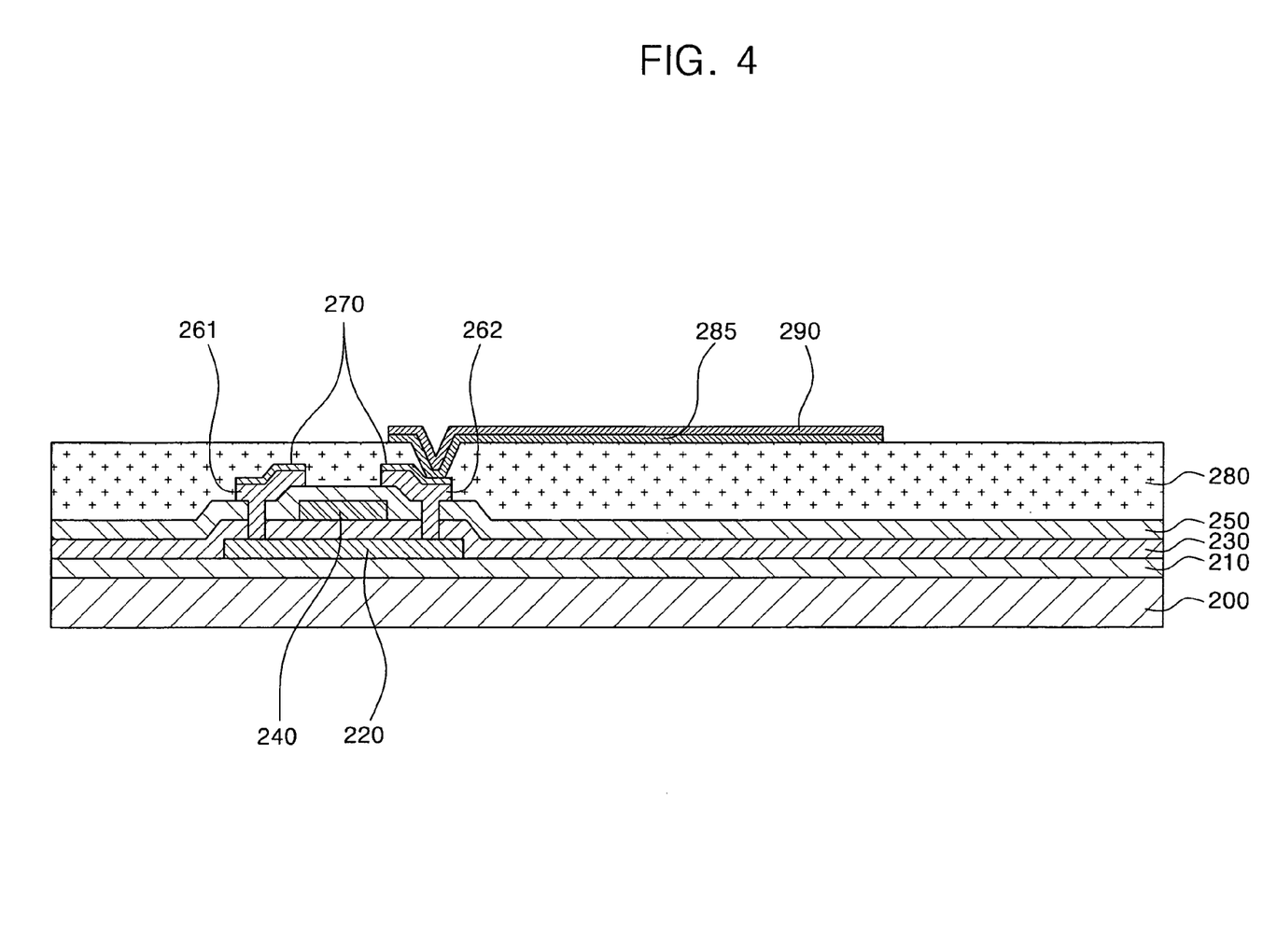
FIG. 4 is a cross-sectional view of an exemplary embodiment of an organic light emitting display device after formation of an insulating layer, second metal layer and first electrode layer in accordance with the principles of the present invention.

Referring to FIG. 4, insulating layer 280 is formed on the entire surface of substrate 200. Insulating layer 280 may be formed of a material having a planarization characteristic, for example, one of a material selected from the group which includes of acryl, polyimide, polyamide, and benzocyclobutene (BCB). Thereafter, insulating layer 280 is etched to form via hole 272 which exposes any one of source and drain electrodes 261 and 262.

Subsequently, a material for second metal layer 285 and a material for first electrode 290 are sequentially deposited on the entire surface of substrate 200 and patterned at the same time, thereby forming second metal layer 285 and first electrode 290.

Second metal layer 285 may be formed of a metal having a good reflection characteristic, for example, a metal selected from the group which includes Al, an Al alloy, Ag, and an Ag alloy. Preferably, second metal layer 285 may be formed of Ag. Also, first electrode 290 may be formed of a material having a high work function, for example, one of indium tin oxide (ITO) and indium zinc oxide (IZO). Preferably, first electrode 290 may be formed of ITO.

Here, second metal layer 285 and first metal layer 270, which are formed on source and drain electrodes 261 and 262, are brought into contact with each other and are electrically connected to each other. In this case, second metal layer 285 should have an EMF equal to or lower than that of first metal layer 270. As described above, when first and second metal layers 270 and 285 are simultaneously exposed to an etchant during a subsequent process of reworking first electrode 290, the occurrence of galvanic corrosion in which a material having a lower EMF is first etched can be prevented.

Figure 5:
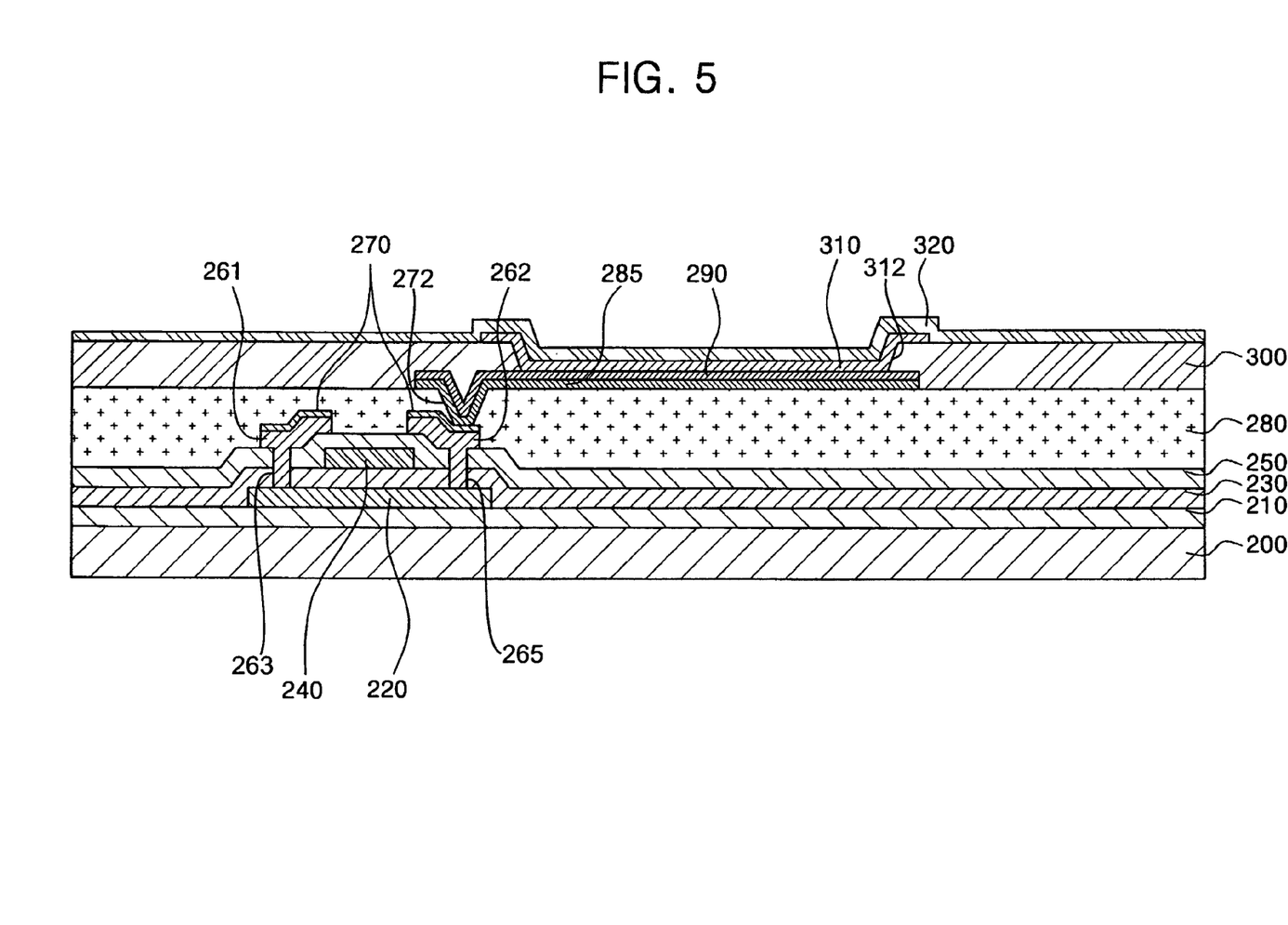
FIG. 5 is a cross-sectional view of an exemplary embodiment of an organic light emitting display device after formation of a pixel defining layer, an organic layer, and a second electrode in accordance with the principles of the present invention.

Referring now to FIG. 5, pixel defining layer 300 is formed on the entire surface of substrate 200. Pixel defining layer 300 may be formed using an organic layer or an inorganic layer. Preferably, pixel defining layer 300 may be an organic layer. More preferably, pixel defining layer 300 may be formed of a material selected from the group which includes BCB, acrylic polymer, and polyimide. Pixel defining layer 300 may be planarized on the entire surface of substrate 200 due to its good flowability. Afterwards, pixel defining layer 300 is etched to form opening 312 exposing first electrode 290.

Organic layer 310 is formed on exposed first electrode 290 and pixel defining layer 300. Organic layer 310 may include at least an emission layer and may also include a hole injection layer, a hole transport layer, an electron transport layer, and an electron injection layer.

Thereafter, a second electrode 320 is formed on the entire surface of substrate 200, thereby completing the OLED as an exemplary embodiment of the principles of the present invention.

As explained thus far, the first metal layer, which is deposited on the source and drain electrodes, is formed of a material having an EMF equal to or higher than the EMF of the second metal layer which functions as a reflective layer. As a result, galvanic corrosion can be prevented from occurring during rework of the first electrode.

Therefore, reliable adhesion of the source and drain electrodes with the first electrode can be ensured, and contact resistance between the source and drain electrodes with the first electrode can be reduced.

As described above, an OLED and a method of manufacturing that OLED according to the principles of the present invention can prevent the occurrence of galvanic corrosion and deterioration of adhesion between source and drain electrodes and a first electrode during rework of the first electrode.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display device (OLED), comprising:

a substrate;

a thin film transistor (TFT) disposed on the substrate, said TFT comprising a semiconductor layer, a gate electrode, a source electrode, and a drain electrode;

first metal layers disposed on both of the source and drain electrodes of the TFT;

an insulating layer disposed on the substrate and on the first metal layers, wherein the insulating layer comprises a via hole exposing any one of the first metal layers disposed on both of the source and drain electrodes;

a first electrode disposed on the insulating layer, electrically connected to the first metal layer which is exposed by the via hole, said first electrode comprising a second metal layer;

a pixel defining layer disposed on the first electrode;

an organic layer disposed on the pixel defining layer; and a second electrode disposed on the organic layer.

2. The OLED according to claim 1, with the source and drain electrodes comprising a single layer formed of one selected from the group consisting of Al, an Al alloy, Mo, a Mo alloy, and Cr, or a multiple layer formed of one selected from the group consisting of Al/MoW, Al/Ta, and Ti/Al/Ti.

3. The OLED according to claim 1, with the first metal layer comprising one of a single layer and a double layer.

4. The OLED according to claim 3, when the first metal layers comprise the single layer, the single layer being formed of one selected from the group consisting of Ag, Pt, and Au.

5. The OLED according to claim 3, when the first metal layers comprise the double layer, with the double layer being formed of one selected from the group consisting of Ag/Pt, Pt/Au, and Ag/Au.

6. The OLED according to claim 3, when the first metal layers comprise the double layer, with the double layer comprising a material layer with a higher electromotive force (EMF) and a material layer with a lower EMF that are stacked sequentially.

7. The OLED according to claim 1, comprised of the first metal layer having a thickness of between 200 Å to 800 Å.

8. The OLED according to claim 1, with the second metal layer comprising an Ag layer.

9. The OLED according to claim 1, with the first metal layer comprising an EMF equal to or higher than an EMF of the second metal layer.

10. An organic light emitting display device (OLED), comprising:

a substrate;

a thin film transistor (TFT) disposed on the substrate, said TFT comprising a semiconductor layer, a gate electrode, a source electrode, and a drain electrode;

first metal layers disposed on both of the source and drain electrodes of the TFT;

an insulating layer disposed on the substrate and on the first metal layers, wherein the insulating layer comprises a via hole exposing any one of the first metal layers disposed on both of the source and drain electrodes;

a first electrode comprised of a second metal layer disposed on the insulating layer, the first electrode being electrically connected to the first metal layer which is exposed by the via hole;

a pixel defining layer disposed on the first electrode;

an organic layer disposed on the pixel defining layer; and a second electrode disposed on an entirety of a surface of the substrate.

11. The OLED according to claim 10, with the source and drain electrodes comprising one of a single layer formed of one selected from the group consisting of Al, an Al alloy, Mo, a Mo alloy, and Cr, and a multiple layer formed of one selected from the group consisting of Al/MoW, Al/Ta, and Ti/Al/Ti.

12. The OLED according to claim 10, with the first metal layer comprising one of a single layer and a double layer.

13. The OLED according to claim 12, when the first metal layers comprise the single layer, with the single layer being formed of one selected from the group consisting of Ag, Pt, and Au.

14. The OLED according to claim 12, when the first metal layers comprise the double layer, with the double layer being formed of one selected from the group consisting of Ag/Pt, Pt/Au, and Ag/Au.

15. The OLED according to claim 12, when the first metal layers comprise the double layer, with the double layer comprising a material layer with a higher electromotive force (EMF) and a material layer with a lower EMF that are stacked sequentially.

16. The OLED according to claim 10, with the first metal layer comprising an EMF equal to or higher than an EMF of the second metal layer.

* * * * *